United States Patent [19]

Kobayashi et al.

[11] Patent Number: 5,416,357

[45] Date of Patent: May 16, 1995

[54] SEMICONDUCTOR INTEGRATED CIRCUIT DEVICE

[75] Inventors: Masato Kobayashi; Chung C. San, both of Kyoto, Japan

[73] Assignee: Rohm Co., Ltd., Kyoto, Japan

[21] Appl. No.: 991,248

[22] Filed: Dec. 16, 1992

[30] Foreign Application Priority Data

Dec. 17, 1991 [JP] Japan .................. 3-353670

[51] Int. Cl.⁶ ............................................. H01L 27/02
[52] U.S. Cl. .................. 257/536; 257/516; 257/533; 257/537; 257/540
[58] Field of Search ............... 257/536, 516, 533, 537, 257/540, 543; 437/918

[56] References Cited

U.S. PATENT DOCUMENTS 4,085,382  4/1978  Barber et al. ..................... 257/536

FOREIGN PATENT DOCUMENTS 2-304964  12/1990  Japan ........................... 257/536

*Primary Examiner*—J. Carroll
*Attorney, Agent, or Firm*—Nikaido, Marmelstein, Murray & Oram

[57] ABSTRACT

A semiconductor integrated circuit device is provided with, in a land formed on a semiconductor substrate, a plurality of resistor layers constituted by semiconductor layers of a conductive type reverse to that of the land, and two of the plurality of the resistor layers are connected in series between a supply voltage and a reference potential. The land of the reference potential side resistor layer of the resistor layers connected in series is formed separately from the lands of the other resistor layers, and a voltage lower than a voltage applied to the other resistor layers is applied to the reference potential side resistor layer.

3 Claims, 5 Drawing Sheets

SEMICONDUCTOR INTEGRATED CIRCUIT DEVICE

BACKGROUND OF THE INVENTION

1. Field of the Invention

The present invention relates to a semiconductor integrated circuit device, and particularly, to a semiconductor integrated circuit device provided with at least two resistor layers of the same resistor value.

2. Description of the Prior Art

In semiconductor integrated circuits, where resistors and active devices are formed on one chip, there are occasions when a plurality of resistors are formed to be of the same value.

For example, in a circuit where a plurality of resistors R1 to R6 are connected to an operational amplifier 1 as shown in FIG. 4, the resistors R1, R3 and R6 are formed to be of the same value (i.e. R1=R3=R6). This circuit is used for an isolation circuit shown in FIG. 5. The isolation circuit is a circuit for canceling noise generated by an engine before the noise intrudes into a power amplifier in an car audio apparatus. In the isolation circuit, noise generated by a noise source 4 intrudes through a path 5 into a minus input terminal of the operational amplifier 1; it also intrudes through a path 6 where a signal source 3 and a buffer amplifier 2 are present into a plus input terminal of the operational amplifier 1. When this happens, as conventionally known, the noise which intrudes into the operational amplifier 1 through the paths 5 and 6 is canceled if the following conditions are satisfied:

(1) R1=R3=R6; and (2) a combined resistance value of the resistors R4 and R5=a combined resistance value of the resistors R2 and R3. If these conditions (1) and (2) are fulfilled, no noise reaches the power amplifier connected to the output side of the operational amplifier 1.

When such a circuit is provided in the form of an integrated circuit, conventionally, the resistors R6, R2 and R3 are formed as shown in FIG. 1. Numeral 10 is a semiconductor substrate. Numeral 11 is a land which is an n-type semiconductor layer formed by an epitaxial growth. Three p+resistor layers 12, 13 and 14 are provided in the land 11. The p+ resistor layers 12, 13 and 14 correspond to the resistors R6, R2 and R3 of FIG. 4, respectively.

To the land 11, a voltage Vcc is applied from a terminal 15 through an n+ area 16. To the resistor layer 12, a voltage is applied from a terminal 17. To the resistor layer 13, the voltage Vcc is applied from a terminal 18. The left end of the resistor layer 14 is connected to ground. The left ends of the resistor layers 12 and 13 are connected to the right end of the resistor layer 14 through a line 19. Numeral 20 is a depletion layer created by providing a reverse bias to a p-n junction. According to the above-mentioned condition (1), the resistor layer 12 (R6) and the resistor layer 14 (R3) must be of the same value in FIG. 1.

With this arrangement, however, since it is extremely difficult to form the resistor layers 12 and 14 (i.e. the resistors R6 and R3) to be of the same value, the above-mentioned conditions (1) and (2) for noise cancellation cannot be satisfied. This problem will be explained with reference to FIG. 2. In FIG. 2, A is a reference potential point (hereinafter referred to as reference point). Assuming that a collector-base junction can be approximated by a graded junction, a width dm of the depletion layer 20 with respect to a potential difference (Vcc−Va) between a potential Va at a point which is a distance a away from the reference point A and the voltage Vcc applied to the land 11 is expressed by the following equation (1):

$$dm = (12\epsilon si \cdot \epsilon o(Vcc - Va)/qb)^{\frac{1}{3}} \qquad (1)$$
$$= K \cdot ((Vcc - Va)/b)^{\frac{1}{3}}$$

where b is a grade of the junction, $\epsilon si$ is a specific inductive capacity, $\epsilon o$ is a dielectric constant in a vacuum, q is an electric charge, and K is a constant.

A spread dl of the depletion layer toward a base diffusion layer at the time of n-type isolation bias is generally shown by a monograph of the Gaussian distribution. Assuming now that dl=B.dm (where B<1), the sheet resistance $\rho s$ is where $\rho$ is a volume resistivity and xi is a depth of the resistor layer at a distance x from a reference point A. If the bias voltage (Vcc−Va) is larger than this, the value of the sheet resistance $\rho s$ increases. FIG. 3 graphically shows a relationship between the bias voltage (Vcc−Va) and the sheet resistance $\rho s$.

As described above, the junction bias voltage varies depending on the voltage applied to the resistor layer, so that the resistance value of the resistor layer varies. As a result, the resistance values of two resistor layers are not of the same value if they are formed under the same condition (i.e. size, etc.) It is difficult to equalize the values by changing the impurity concentration or by adjusting the size.

SUMMARY OF THE INVENTION

An object of the present invention is to provide a semiconductor integrated circuit device where a plurality of resistor layers are easily formed to be of the same resistance value.

To achieve the above-mentioned object, in a semiconductor integrated circuit device of the present invention where a plurality of resistor layers are provided in a land formed on a semiconductor substrate and the resistor layers are semiconductor layers of a conductive type reverse to that of the land, a land of a resistor layer of the plurality of resistor layers, to which a voltage lower than a voltage applied to the other resistor layers is applied is formed separately from lands of the other resistor layers, and means is provided for applying to the land of the resistor layer a voltage for causing an average junction bias voltage of the former resistor layer to be substantially equal to an average junction bias voltage of the latter resistor layers.

With such features, for example, a potential V1 from a reference point of a resistor layer to which a low voltage is originally to be applied is lower than a corresponding potential V2 of another resistor layer. If a land voltage Vc1 of the former resistor layer is lower than a land voltage Vc2 of the latter resistor layer, average bias voltages (Vc1−V1) and (Vc2−V2) on which respective depletion layers depend can be equalized. Thereby, the resistance values of the resistor layers can be equalized.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
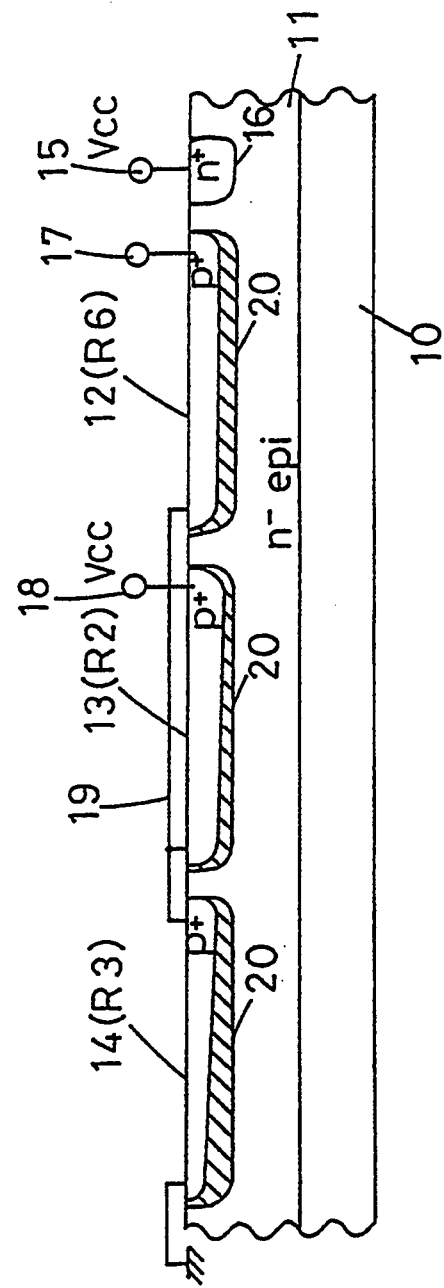
FIG. 1 cross-sectionally shows a structure of a principal portion of a conventional semiconductor integrated circuit device.
Figure 2:
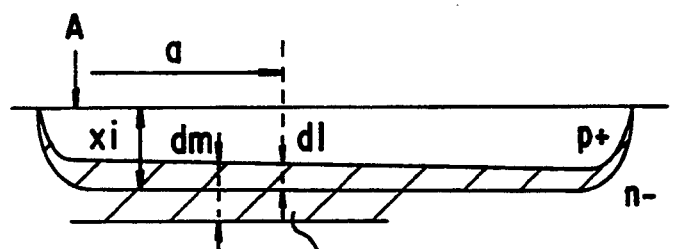
FIG. 2 is a view for explaining the fact that a resistor value of a resistor layer is influenced by an average junction bias voltage applied to a depletion layer created between a land and the resistor layer.
Figure 3:
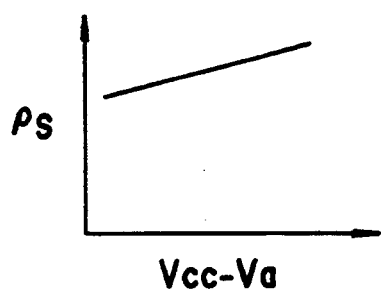
FIG. 3 graphically shows a relationship between a sheet resistor of the resistor layer and the average junction bias voltage.
Figure 6:
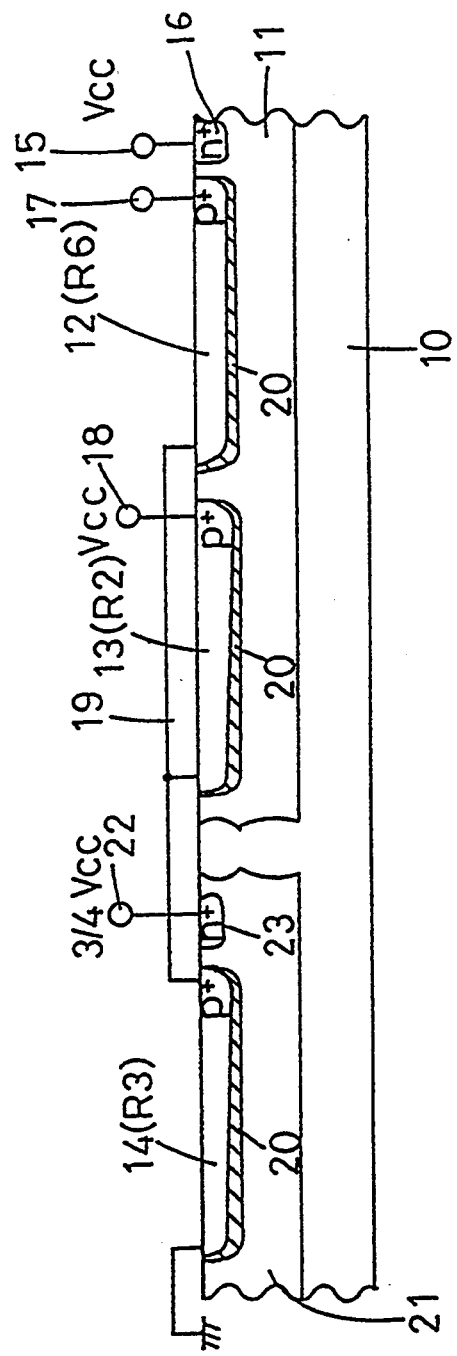
FIG. 6 cross-sectionally shows a structure of a principal portion of the semiconductor integrated circuit device embodying the present invention.

In FIG. 6 showing an embodiment of the present invention, portions the same as those of FIG. 1 are denoted by the same reference designations. Description thereof will be omitted. This embodiment is characterized in that a land 21 where a resistor layer 14 is provided is formed separately from a land 11 where other resistor layers 12 and 13 are provided and that a voltage three-fourths the value of a voltage Vcc is applied from a terminal 22 to the land 21 through an n+ area 23.

With this arrangement, although the average voltage of the resistor layer 14 is Vcc4, since the land voltage is ($\frac{3}{4}$)×Vcc, the average junction bias voltage Vcc×($\frac{3}{4}$)-Vcc/4 of the resistor layer 14 is Vcc2. On the other hand, the average potential of the resistor layer 12 is Vcc2, since a voltage to be applied thereto through a terminal 17 is Vcc2. A voltage to be applied to a land 11 through a terminal 15 is Vcc. Therefore, the average junction bias voltage of the resistor layer 12 is Vcc−Vcc2=Vcc2. In this case, as understood by the equations (1) and (2), the resistance values of the resistor layers 12 and 14 are equal to each other.

Figure 4:
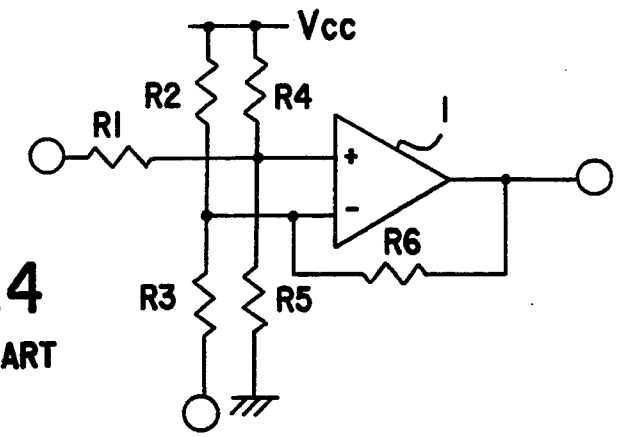
FIG. 4 is a circuit diagram of an operational amplifier embodying a semiconductor integrated circuit device of the present invention.
Figure 5:
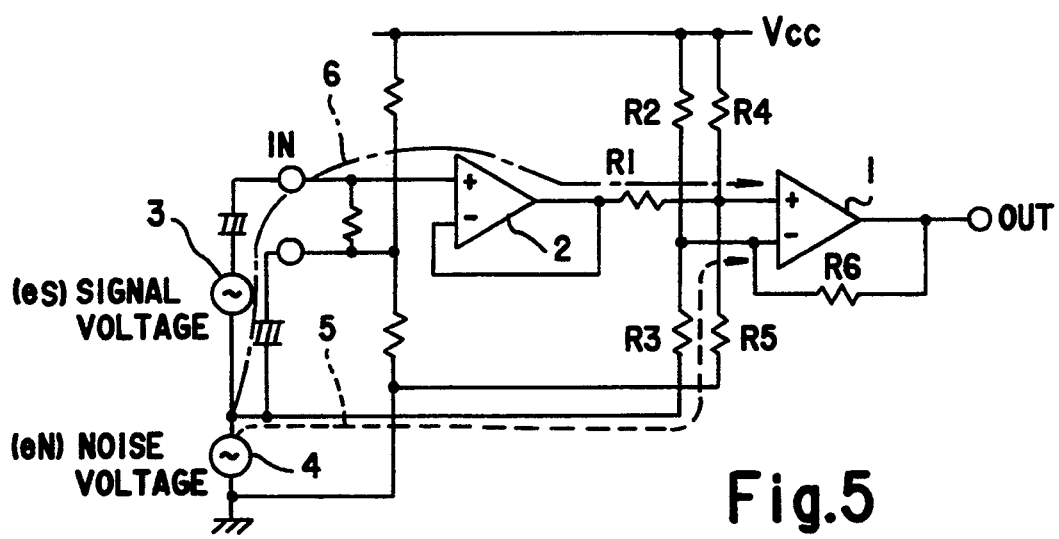
FIG. 5 is a view showing an isolation circuit embodying the operational amplifier of FIG. 4.

By employing the above-described arrangement of the present invention as the resistors R1 to R6 of FIG. 4, it is possible to equalize the values of the resistors R1, R3 and R6 and to equalize the combined resistance value of the resistors R2 and R3 to the combined resistance value of the resistors R4 and R5. As a result, the isolation circuit of FIG. 5 can easily and highly-accurately be realized in the form of an integrated circuit.

Figure 7:
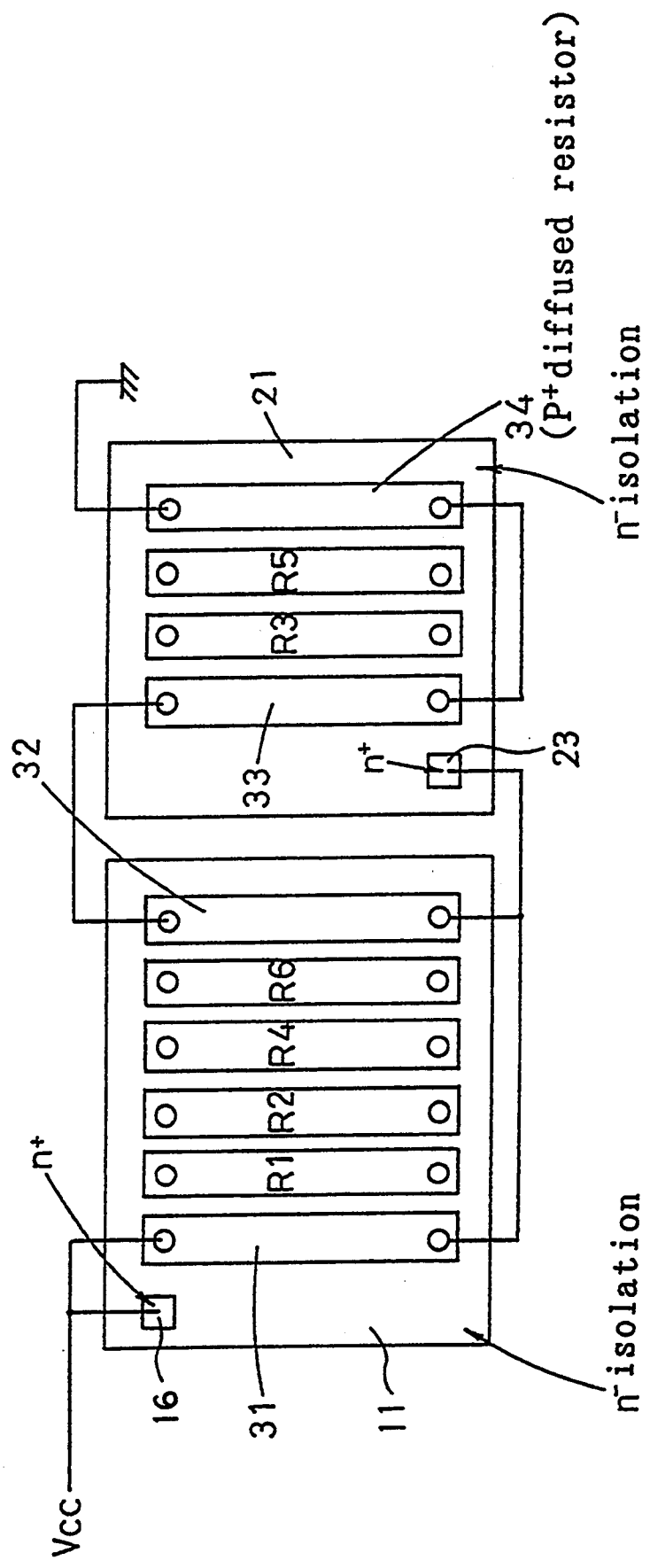
FIG. 7 is a plan view showing a part of the semiconductor integrated circuit device of the present invention, which part is for producing a voltage to be applied to a land.

In this embodiment, it is necessary to create a voltage of ($\frac{3}{4}$)×Vcc. This voltage is easily created by using dummy resistors 31 to 34 as shown in FIG. 7. The dummy resistors 31 to 34 are formed in a P+diffusion layer. The dummy resistors are resistors which have conventionally been provided in the periphery of the resistors R1, R2, R4 and R6 and resistors R3 and R5 for improving the relative accuracy of the resistors. By using them for voltage dividing as shown in FIG. 7, a voltage three-fourths the voltage Vcc is obtained substantially without providing any extra resistors. That is, impurity concentrations differ between resistors formed at central portions and those formed at end portions of the lands 11 and 21 because of the difference in atmosphere, and the resistor values of the resistors differ accordingly; to prevent this, the resistors 31, 32, 33 and 34 formed at end portions are used as dummy resistors. Since the dummy resistors 31 to 34 have resistor values lower than those of the resistors R1, R2, R4 and R6 and of the resistors R3 and R5, they are used for creating a voltage of Vcc×($\frac{3}{4}$).

To the land 11, the voltage Vcc is applied through an n+ layer 16. A voltage created by dividing the voltage Vcc to three-fourths by the dummy resistors 31, 32, 33 and 34 is applied to the land 21 through the n+ layer 23.

As described above, according to the present invention, by separately forming lands of a plurality of resistor layers whose resistor values are to be equalized and by applying voltages of different values to the lands, the average bias voltages applied to the p-n junction of the resistor layers are equalized, thereby equalizing the resistance values of the plurality of resistor layers. As a result, the equalization of the resistor values is easily and highly-accurately achieved.

Obviously, many modifications and variations of the present invention are possible in light of the above teachings. It is therefore to be understood that within the scope of the appended claims, the invention may be practiced other than as specifically described.

What is claimed is:

1. A semiconductor integrated circuit device provided with a plurality of resistor layers of a same resistor value, comprising:
   a semiconductor substrate;
   a first and a second lands provided on the semiconductor substrate;
   a first resistor layer constituted by a semiconductor layer of a conductive type reverse to that of the first land and provided in the first land;
   a second resistor layer constituted by a semiconductor layer of a conductive type reverse to that of the second land and provided in the second land;
   first voltage applying means for applying to the second resistor layer a voltage lower than a voltage applied to the first resistor layer; and
   second voltage applying means for applying to the first and second lands a land voltage which causes average junction bias voltages of the first and second resistor layers to be substantially equal to each other
   wherein the first land is further provided with a third resistor layer with a first terminal of the third resistor layer being connected to a supply voltage point, a second terminal of the third resistor layer being connected to a first terminal of the second resistor layer and a first terminal of the first resistor layer, a voltage is applied to a second terminal of the first resistor layer, and a second terminal of the second resistor layer is connected to the ground.

2. A semiconductor integrated circuit device according to claim 1, wherein the voltage applied to the second terminal of the first resistor layer is one-half of a supply voltage Vcc, a voltage of Vcc/4 is created at a connection between the first and third resistor layers, the voltage Vcc is applied to the first land, and a voltage of Vcc×($\frac{3}{4}$) is applied to the second land.

3. A semiconductor integrated circuit device provided with two resistor layers of a same resistor value, comprising:

a semiconductor substrate;

a first and a second lands provided on the semiconductor substrate;

a first resistor layer constituted by a semiconductor layer of a conductive type reverse to that of the first land and provided in the first land;

a second resistor layer constituted by a semiconductor layer of a conductive type reverse to that of the second land and provided in the second land;

dummy resistor layers provided at each end portion of each of the first and second lands;

first voltage applying means for applying to the second resistor layer a first voltage lower than a second voltage applied to the first resistor layer; and second voltage applying means for creating by using the dummy resistor layers a land voltage which causes average junction bias voltages of the first and second resistor layers to be substantially equal to each other and applying the land voltage to the first and second lands.

* * * * *